US 12,483,191 B2

(12) United States Patent
Collonville et al.

(10) Patent No.: US 12,483,191 B2
(45) Date of Patent: Nov. 25, 2025

(54) METHOD AND APPARATUS FOR OSCILLATOR FREQUENCY CALIBRATION

(71) Applicant: NXP B.V., Eindhoven (NL)

(72) Inventors: Nicolas Collonville, Biot (FR); Axel Le Bourhis, Le Cannet (FR)

(73) Assignee: NXP B.V., Eindhoven (NL)

( * ) Notice: Subject to any disclaimer, the term of this patent is extended or adjusted under 35 U.S.C. 154(b) by 170 days.

(21) Appl. No.: 18/310,612

(22) Filed: May 2, 2023

(65) Prior Publication Data

US 2024/0146242 A1    May 2, 2024

(30) Foreign Application Priority Data

Nov. 1, 2022  (EP) ..................................... 22306654

(51) Int. Cl.
*H03B 5/04*    (2006.01)
(52) U.S. Cl.
CPC ...................................... *H03B 5/04* (2013.01)
(58) Field of Classification Search
CPC .............. H03B 5/04; H03L 1/022; H03L 7/00
USPC ........................................................ 331/1 R
See application file for complete search history.

(56) References Cited

U.S. PATENT DOCUMENTS

| 9,680,413 | B2 | 6/2017 | Paidimarri et al. |
| 2013/0222069 | A1 | 8/2013 | Paidimarri et al. |
| 2022/0407459 | A1* | 12/2022 | Jung ........................ H03K 3/02 |

OTHER PUBLICATIONS

Lim et al., "Ultra Low Power RC Oscillator for System wake-up using highly precise Auto-Calibration Technique," IEEE, 2010 Proceedings of ESSCIRC, Sep. 14-16, 2010, 4 pages.
Suciu et al., "Experimental Clock Calibration on a Crystal-Free Mote-on-a-Chip," IEEE Infocom 2019—IEEE Conference on Computer Communications Workshops (Infocom Wkshps), Apr. 29, 2019-May 2, 2019, 6 pages.
Scholl et al., "A 80 nW, 32 kHz Charge-Pump based Ultra Low Power Oscillator with Temperature Compensation," ESSCIRC Conference 2016: 42nd European Solid-State Circuits Conference, Sep. 12-15, 2016, 4 pages.

* cited by examiner

*Primary Examiner* — Richard Tan (57) ABSTRACT

A free running oscillator in a circuit of an electronic device is calibrated by determining that the circuit of the electronic device is in an awake state; measuring an indication of frequency of the free running oscillator in response to the circuit being in the awake state; and calibrating a frequency of the free running oscillator based on the indication of frequency and the circuit being in the awake state.

18 Claims, 5 Drawing Sheets

METHOD AND APPARATUS FOR OSCILLATOR FREQUENCY CALIBRATION

CROSS-REFERENCE TO RELATED APPLICATIONS

This application claims the priority under 35 U.S.C. § 119 of European Patent application no. 22306654.9, filed on 1 Nov. 2022, the contents of which are incorporated by reference herein.

FIELD OF USE

This disclosure generally relates to oscillator frequency calibration, and more particularly to reducing power associated with an oscillator frequency calibration process in an electronic device such as a low power wireless device.

BACKGROUND

An electronic device such as an internee of thing (IOT) device switches to a low power mode to preserve battery life and reduce power consumption. To synchronize operations in the low power mode, the low power device typically uses an external low frequency crystal running at a low frequency such as 16 or 32 kHz which acts as a time base during a sleep mode. The low frequency crystal increases a cost of materials of the low power device and occupies a large area on a printed circuit board of the electronic device. To reduce this cost and the area occupied, the low frequency crystal is typically replaced with an internal free running oscillator which typically has a frequency of 32 kHz or lower. The free running oscillator has a highly degraded frequency accuracy to a reference frequency (up to 50 times less accurate compared to the low frequency crystal).

The drawings are for the purpose of illustrating example embodiments, but it is understood that the embodiments are not limited to the arrangements and instrumentality shown in the drawings.

DETAILED DESCRIPTION

The detailed description of the appended drawings is intended as a description of the various embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Overview

A free running oscillator which has highly degraded frequency accuracy needs to be calibrated. Calibration of a frequency of the free running oscillator in an electronic device takes time and increases power consumption of the electronic device. The calibration process includes determining the frequency of the free running oscillator by measuring a number of pulses output by the oscillator when a highly accurate reference clock outputs a certain number of pulses. A number of pulses output by the oscillator compared to the number of pulses output by the reference clock is indicative of the frequency of the oscillator. The pulse count difference is measured over a period of time such as several dozen milliseconds by counting the number of pulses output by the oscillator when the certain number of pulses is output by the reference clock. The frequency of the oscillator is then adjusted based on the pulse count difference on a regular periodic basis to calibrate the oscillator frequency. The pulse count difference is affected by one or more of jitter of the pulses of the oscillator, jitter of the pulses of the reference clock, precision of the reference clock, and the certain number of pulses output by the reference clock over which the pulse count difference is measured. Further, the calibration process consumes power of the electronic device and reduces a battery life of a battery that might be powering the electronic device.

Embodiments disclosed herein are directed to reducing power consumption associated with calibrating the frequency of the oscillator. In an example, a frequency of the oscillator is calibrated is based on a temperature gradient of the electronic device such that a number of times the frequency of the oscillator is calibrated over time is typically less than if the oscillator is calibrated on a regular periodic basis, reducing power associated with the calibration process. In another example, measurements of a difference in pulse count between the free running oscillator and a reference clock are filtered to determine a pulse count difference estimate indicative of the frequency of the oscillator. The filtering allows for reducing a time to determine the frequency of the oscillator and an amount of power consumed to calibrate the frequency of the oscillator while being able to perform an accurate calibration. In yet another example, the oscillator is calibrated when a circuit of the electronic device which has the oscillator is already awake such that the circuit does not need to be awaken only to perform the calibration, reducing power associated with calibrating the frequency of the oscillator. Well known instructions, protocols, structures, and techniques have not been shown in detail in order not to obfuscate the description.

Example Systems

Figure 1:
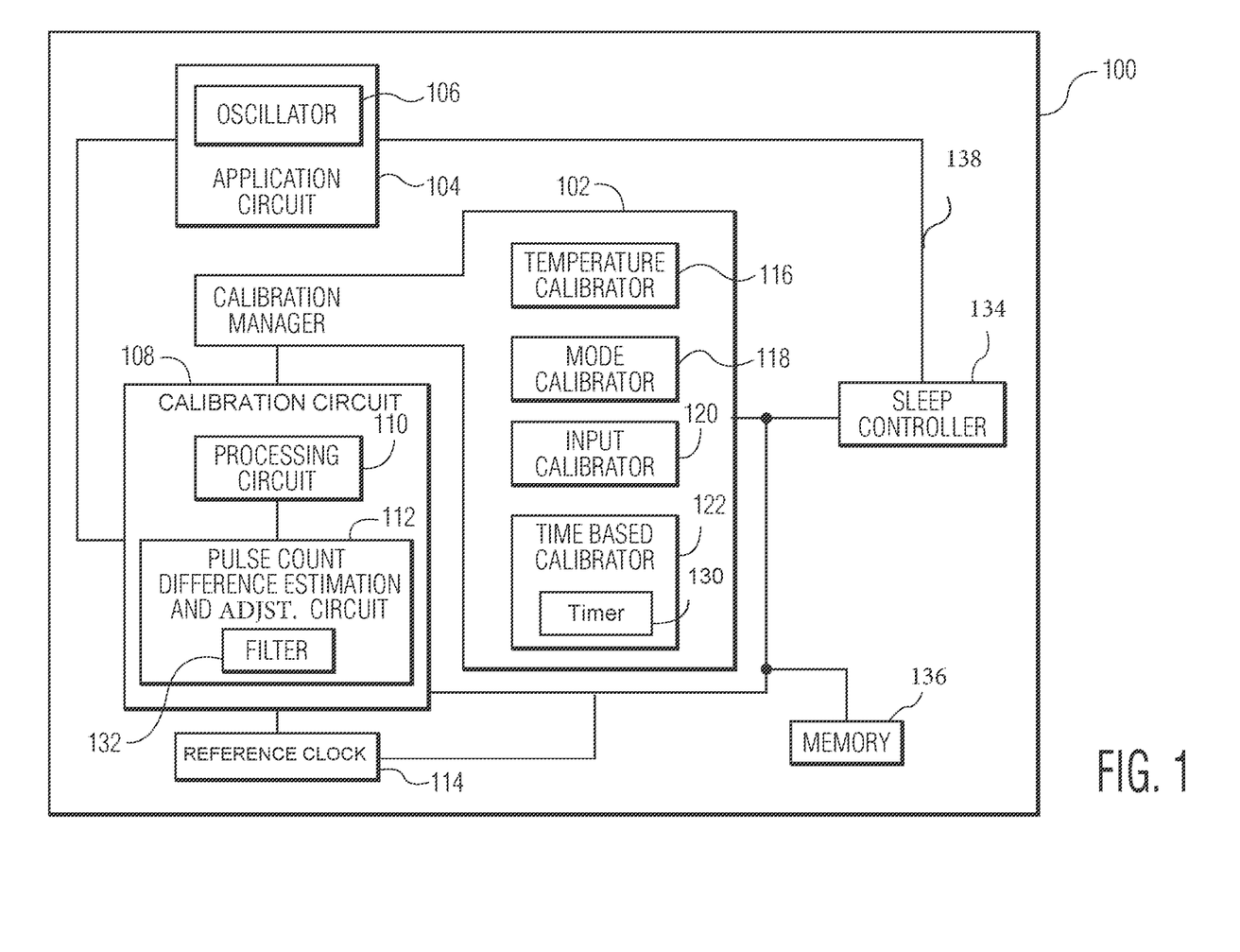
FIG. 1 is a block diagram of an example electronic device arranged with a circuit to calibrate a frequency of a free running oscillator of the electronic device in accordance with an embodiment.

FIG. 1 is a block diagram of an example electronic device 100 arranged with a circuit to calibrate a frequency of a free running oscillator 106 in accordance with an embodiment. The electronic device 100 may be for example a wireless device or an internet of thing (IOT) device. The free running oscillator 106 may have hardware such as resistor-capacitor (RC) circuit or an inductor-capacitor (LC) circuit, as examples, which generates a clock signal for an application circuit 104 of the electronic device 100 which is in a low power state or sleep state. The clock signal may be a timebase for the application circuit 104 in the low power or sleep state. The application circuit 104 may implement functionality of the electronic device 104 such as processing of wireless signals received by the electronic device 100 or transmitted by the electronic device 100, for example, when the electronic device is the wireless device or IOT device. The clock signal may be defined by a plurality of pulses and a frequency of the oscillator 106 may be defined by the frequency of the pulses of the clock signal. The frequency of the oscillator 106 may vary over time and result in a need to calibrate the frequency of the oscillator 106. Calibration of the oscillator 106 as described herein is a process of adjusting a frequency of the oscillator 106 based on a difference in frequency of the oscillator 106 and a frequency of a reference clock 114 which may be a highly accurate clock such as a crystal oscillator compared to the oscillator 106. The reference clock 114 may output a clock signal with a plurality of pulses, albeit at the highly accurate frequency, indicative of the frequency of the reference clock 114. The reference clock 114 is shown to be a component of the electronic device 100 but in other examples the reference clock may be remote to the electronic device and timing may be received via a signaling process with the electronic device 100. Similarly, pulses output by the oscillator 106 is indicative of the frequency of the oscillator 106. In an example, the calibration of the oscillator 106 may comprising adjusting a difference of a number of pulses output by the oscillator 106 when the reference dock 114 outputs a particular number of pulses. For example, a number of pulses output by the oscillator 106 may be counted when the reference clock 114 outputs 1000 pulses. The frequency of the oscillator 106 may be adjusted as a result of adjusting the number of pulses output by the oscillator 106 when the reference clock 114 outputs a particular number of pulses which results in a change in frequency of the oscillator 106. The number of pulses may be increased or decreased based on the frequency of the reference clock 114. A calibration circuit 108 may be arranged to perform this calibration based on control by a calibration manager 102 and a sleep controller 134 which are described below in further detail. In examples, the electronic device 100, the calibration manager 102, the calibration circuit 108, application circuit 104, the reference clock 114, the sleep controller 134, and the free running oscillator 106 may be coupled together via illustrated data paths, an example of which is data path 138, which facilitate communication within the electronic device 100 to perform various functions described herein and further include one or more of analog circuit, mix signal circuit, memory circuit, logic circuit, and processing circuit that executes code stored in a memory that when executed by the processing circuit performs the disclosed functions, among other implementations.

Calibration of the frequency of the internal free running oscillator 106 typically takes time and increases an amount of power consumed by the electronic device 100. To reduce the power consumption associated with the calibration process, the calibration manager 102 may have one or more of a temperature calibrator 116, a mode calibrator 118, an input calibrator 120, and a timer based calibrator 122 to facilitate calibration of the frequency of the oscillator 106.

In an example, the frequency of the free running oscillator 106 is calibrated based on a temperature gradient such that a number of times the frequency of the oscillator 106 is calibrated is typically less than if the oscillator is calibrated on a regular periodic basis. The temperature calibrator 106 may receive an indication of temperature of the electronic device 100 or an environment in which the electronic device 100 is located from a temperature sensor (not shown) of the temperature calibrator 106. The temperature calibrator 106 may determine a specific variation in temperature over a period of time. Pulses output by the oscillator 106 and reference clock 114 are indicative of the frequency of the respective device. A pulse count difference is measured over a period of time such as several dozen milliseconds by counting a number of pulses output by the oscillator 106 when the reference clock 114 outputs a certain number of pulses. A difference in the number of pulses is indicative of a frequency difference of the oscillator 106 compared to the reference clock 114. For example, if the oscillator 106 is known to have a difference of 1000 pulses per million (ppm) in its clock signal compared to the reference clock 114 for every 10 degrees of temperature change, and if the pulse difference shall be kept within 500 ppm, then a calibration shall be triggered after 5 degrees of temperature variation so that the pulse difference does not exceed 500 ppm. The temperature calibrator 106 may cause the calibration manager 102 to send a calibration signal to the calibration circuit 108 and cause the calibration circuit 108 to adjust the frequency of the oscillator 106 based on the pulse count difference.

In another example, the frequency of the oscillator 106 may be calibrated based on a mode of the electronic device 100. A mode calibrator 118 may determine the mode of the electronic device 100. The mode may define functions being performed by the electronic device 100 and indicated in a memory 136 of the electronic device 100 which stores the mode which is accessed by the mode calibrator 118. For example, if the electronic device 100 is a Bluetooth device, the electronic device 100 may operate to send advertising packets to advertise its capabilities in an advertising mode or data packets to communicate with a remote device in a connected mode. The calibration of the frequency of the oscillator 106 may be needed less often during the advertising mode when the electronic device 100 is broadcasting adverting packets compared to the connected mode when the electronic device 100 is in a communication session with the remote device. The mode calibrator 118 may determine the mode of the electronic device 100 based on the indication stored in the memory 136 and cause the calibration manager 102 to send a calibration signal to the calibration circuit 108 such that the frequency of the oscillator 106 is calibrated less often in the advertising mode compared to the communication mode because less precision in frequency is needed in the advertising mode compared to the communication mode. For example, a rate by which the calibration manager 102 signals the calibration circuit 108 to perform the calibration may be less in one mode compared to another mode, where the rate is measured via the reference clock 114. In an example, the calibration manager 102 may send the calibration signal at the predetermined rate based on a timing of the reference clock 114.

In another example, an input calibrator 120 receives an indication to perform a calibration of the oscillator 106. The indication may be a signal from a user to perform the calibration to improve accuracy of the frequency of the oscillator 106 or a signal from the application circuit 104 of the electronic device 100 which may indicate that hardware or software needs increased accuracy of the frequency of the oscillator 106 to operate. Based on indication, the input calibrator 120 may cause the calibration manager 102 to send a calibration signal to the calibration circuit 108 to perform the calibration of the oscillator 106.

In yet another example, a timer-based calibrator 122 may cause a calibration to be performed based on a timer 130. The timer-based calibrator 122 may maintain a duration of how long ago the frequency of the oscillator 106 was calibrated based on the timer 130, and if the duration is exceeded then the timer-based calibrator 122 may cause the calibration manager 102 to send a calibration signal to the calibration circuit 108 to perform a calibration of the frequency of the oscillator 106. The timer 130 may maintain a count of time based on the reference clock 114. The timer calibrator 122 may further receive from the calibration circuit 108 an indication that a calibration is to be performed or completed in which case the timer 130 is reset and restarted. If the timer 130 reaches a predetermined value which indicates that a maximum duration has transpired since the frequency of the oscillator 106 was calibrated, then the timer-based calibrator 122 may cause a calibration signal to be sent from the calibration manager 102 to the calibration circuit 108 to calibrate the frequency of the oscillator 106.

The calibration circuit 108 has a processing circuit 110 and a pulse count difference estimate and frequency adjustment circuit 112 to perform the calibration of the frequency of the oscillator 106. In an example, processing circuit 110 may receive the calibration signal from the calibration manager 102 and send a signal to the calibration manager 102 when the calibration is done. The pulse count difference estimate and frequency adjustment circuit 112 may estimate a pulse count difference between the reference clock 114 and the oscillator 106. The pulse count difference is measured based on receiving the clock signal from the oscillator 106 and the reference clock 114 and counting pulses of the clock signal output by the oscillator 106 and pulses of the clock signal output by the accurate reference clock 114. A comparator may determine a difference between a number of pulses output by the oscillator 106 when the highly accurate reference clock 114 outputs a certain number of pulses. The pulse count difference may be indicative of the frequency difference of the oscillator 106 compared to the reference clock 114. Further, both pulses of the clocks may have jitter in a clock period that might affect determination of a reliable frequency of the oscillator. More measurements over multiple periods of time may be needed to estimate the pulse count difference depending on the amount of jitter resulting in increased power consumption and may take several dozen milliseconds.

The pulse count difference is measured a plurality of times. Based on the measurements, the pulse count difference estimation and frequency adjustment circuit 112 may apply a filter 132 to filter the pulse count difference measurements to reduce the noise caused by the clock jitter and measurement error. The filter 132 will smoothen the pulse count difference measurements and therefore result in a shorter time to determine a pulse count difference estimate. The filter 132 that is applied may depend on computing power and available memory of the electronic device. For example, if the pulse count difference estimation and frequency adjustment circuit 112 has a low power MCU (Micro Controller Unit), the integers and powers of two dividing factors may be used for maximum efficiency. Two types of algorithm may be used to leverage capabilities of the MCU including a finite impulse response (FIR) filter and a first order infinite impulse response filter.

In an example, the finite impulse response filter may be a simple moving average over N samples where each sample is weighed by a weight $b_n$ which may be 1 and where n is an index. N samples may be stored in the memory 134 of the electronic device 100 which correspond to a most recent N pulse difference measurements to compute an average over all those samples where each sample is a pulse count difference measurement. Each time a new pulse count difference measurement arrives, an oldest pulse count difference measurement may be removed from a buffer and the new pulse count difference measurement may be stored as:

$$y[n] = b_0 x[n] + b_1 x[n-1] + \ldots + b_N x[n-N]$$
$$= \sum_{i=0}^{N} b_i \cdot x[n-i]$$

A number of samples used in the finite impulse response filter may directly impact the pulse count difference estimate. The greater the number of samples, the less a pulse count difference estimate error. In some examples, an increase in the number of samples could result in the finite impulse response filter being responsive to a temperature gradient, meaning that in case of temperature variation, the pulse count difference estimate may have an bias error due to the temperature variation. A specific number of pulse count difference measurements may be performed to reduce error due to the clock noise (jitter, etc.) and reduce the bias error due to the temperature variation, knowing that more measurements may need to be performed in case of temperature variation to reduce the bias error. Further, if the number of samples is a power of 2, the pulse count difference estimate may be determined with only with add, sub and bit shift operations. A tradeoff with the finite impulse response filter is that if one needs many samples to determine the pulse count difference estimate, a memory footprint to store the samples will increase. Also, as the same weight is applied to each sample, the older samples may have a same importance as the newer samples, which could affect whether the pulse count difference estimate is reactive to a disturbance such as a temperature gradient which affects the determination of the frequency of the oscillator 106.

In an example, the infinite impulse response filter may approximate a N sample moving average. The infinite impulse response filter may be defined by an exponential moving average with a decreasing factor of alpha=1/N or alpha=2/(N−1). The exponential moving average filter may be represented as NewAverage=alpha*NewValue+(1−alpha)*LastAverage. Alternatively, the infinite impulse response filter may be defined by a modified moving average filter represented as: NewAverage=(NewValue+(N−1)*LastAverage)/N. The Last Average (pulse count difference estimate) may be a last average of a plurality of pulse count difference measurements and the New Average may be an updated pulse count difference estimate based on the Last Average. The infinite impulse response filter may be a first order Infinite Impulse Response filter (IIR) which does not require to store N samples like the FIR filter to determine the pulse count difference estimate. Instead, only a recent pulse count difference measurement and latest average may need be stored, such that a memory footprint of the memory 132 is reduced by N. Also, if N is a power of two (2, 4, 8, 16, etc.), a bit shift operation may be used to compute the pulse count difference estimate instead of a division. In an example, one of the filters described above may be used to estimate a pulse count difference. Further, N may be increased to increase smoothing with a tradeoff such that as more samples are used in the average, N may be chosen depending on a particular pulse count difference estimate error which is tolerated.

The pulse count difference estimate is indicative of a frequency estimate of the oscillator 106. Based on the pulse count difference estimate, the pulse count difference estimate and frequency adjustment circuit 112 may adjust the frequency of the oscillator 106 and the reference clock 114 to reduce the pulse count difference estimate. The pulse count difference estimate and frequency adjustment circuit 112 may adjust the frequency of the oscillator 106 to reduce the pulse count difference by adjusting the number of pulses output by the oscillator 106 for a certain number of pulses output by the reference clock 114. The number of pulses output by the oscillator 106 may be increased or decreased depending on the frequency of the reference clock 114. The compensation may be done in hardware by a trimming process (e.g., adjusting capacitance of a capacitor bank) to adjust a number of pulses output by the oscillator 106 and frequency of the oscillator 106. Alternatively, the compensation may be done in software by adjusting a number of pulses output by the hardware of the oscillator 106 (e.g., RC circuit or LC circuit) and frequency of the oscillator 106. For example, the software of the oscillator 106 may be arranged to cause the oscillator 106 to output a clock pulse for every s clock pulses generated by the hardware, where s is programmable.

In an example, the calibration manager 102 may control calibration of the oscillator 106. The calibration manager 102 may cause the pulse count difference estimation and frequency adjustment circuit 112 to calibrate the frequency of the oscillator 106 and receive an indication from the pulse count difference estimation and frequency adjustment circuit 112 when the calibration is complete. In an example, the calibration manager 108 may control 5 a calibration time when the calibration signal is sent to the calibration circuit 102 to perform the calibration. The application circuit 104 may operate in an awake state and a low power state. The sleep state may be a state where one or more subcircuits of the application circuit 104 may be in a low power mode to reduce power consumption in contrast to the awake state where one or more 10 subcircuits of the application circuit 104 may be performing functions associated with operation of the electronic device 100 such as transmission and reception of packets and consuming power in the case that the electronic device 100 is a wireless device. The calibration of the oscillator 106 may need to be performed when the application circuit 104 which includes the oscillator 106 is awake. A time when the calibration is performed is selected to reduce a duration that the 15 electronic device 100 is in an awake state and consuming power. For instance, if the calibration manager 102 starts the calibration when the electronic device 100 has no other activity to do, the calibration may force the electronic device 100 to wake up and remain active only for this calibration and all power consumed will be due to the calibration. However, if the calibration manager 102 starts the calibration on a wake up from the low power state and when other 20 activity is also run by the electronic device 100, then the calibration may have less impact on power consumption because power is not consumed to only wake up the application circuit 104 to perform the calibration. A sleep controller 134 may control when the application circuit 104 is in the sleep state or the awake state and the calibration manager 102 may query the sleep controller 134 for the state of the application circuit 104 or when a state of the application circuit 104 may transition from an awake state to a sleep state and vice versa. In this regard, the awake state of the electronic device 100 may be known and the calibration manager 102 may adjust the calibration time to fit within a time that the application circuit 104 is already awake, including when the calibration is performed and how long to perform the calibration. For instance, if the awake time is 5 milliseconds (ms), the calibration manager 108 may make the calibration 30 duration to be below 5 ms. Further, the calibration manager 108 may cause the calibration to be performed on a next wake up event, so that power impact is limited instead of specifically waking up the application circuit 104 to perform the calibration which will impact power consumption of the electronic device 100 and time that the application circuit 104 is awake.

Figure 2:
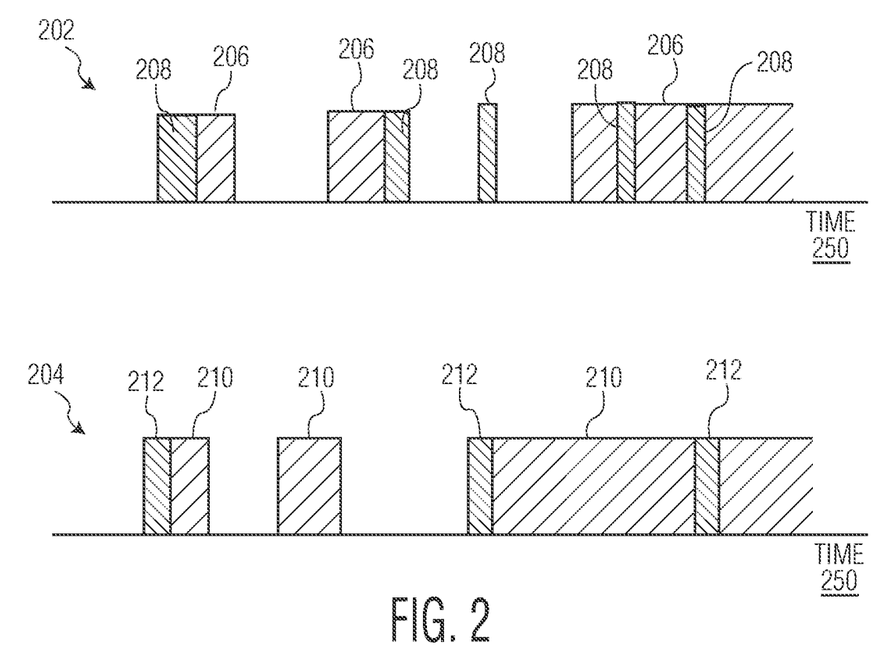
FIG. 2 illustrates example timing diagrams which compare a conventional calibration of the oscillator with an improved calibration of the oscillator in accordance with an embodiment.

FIG. 2 illustrates example timing diagrams 202, 204 which compare a conventional calibration of the oscillator 106 with an improved calibration of the oscillator 106 in accordance with an embodiment. The diagrams 202, 204 show various time periods on time axis 250 when one or more of the application circuit 104 may be in awake state and also when calibration of the frequency of the oscillator 106 is performed. The application circuit 104 may be configured to be in a sleep state when the circuit 104 is asleep and an awake state when the circuit 104 is awake. Periods 206 shows device activity when the application circuit 104 is in the awake state and performing activities other than calibration of the oscillator 106 and periods 208 shows calibration of the oscillator 106 during a conventional calibration operation. A hashing pattern in a rising direction (left to right) of period 206 or falling direction (left to right) in period 208 may indicate different durations associated with the periods. The calibration is done before or after the periods 206, or a regular basis when the electronic device 100 is awake, or separate from the periods 206 which results in additional dine that the application circuit 104 needs to be in the awake state, increasing power consumption. In examples, the calibration manager 102 may cause the calibration circuit 108 to calibrate the frequency of the oscillator 106 based on when the application circuit 104 is already in an awake state. Periods 210 shows device activity when the application circuit 104 is already awake during which functions not associated with calibration may be performed and periods 212 shows calibration of the oscillator 106 during the awake state resulting in improved calibration operation. Similarly, a hashing pattern in a rising direction (left to right) of period 210 or falling direction (left to right) in period 212 may indicate different durations associated with the periods. In an example, the calibration manager 102 may receive an indication to perform calibration from one or more of the calibrators 116-120, but send a signal to the calibration circuit 100 to perform the calibration during the periods 210 which overlap with periods 212. The calibration in this example may result in no additional time that the application circuit 104 needs to be awaken and minimal increase in power consumption because the application 104 does not need to be awaken to only perform the calibration.

The processing circuit 110 of the calibration circuit 108 may have a calibration state machine which controls the calibration process. Based on the calibration signal provided by the calibration policy manager 102 which indicates to perform the calibration, the calibration state machine may perform the calibration of the oscillator 106 and indicate whether a calibration is complete. The calibration state machine may move between states associated with receiving a calibration signal from the calibration manager 102, determining an estimate of the frequency error of the oscillator 106 compared to the reference clock 114 based on the pulse count difference estimate, adjusting the frequency of the oscillator 106 as a result of adjusting a pulse count difference between the reference clock 114 and the oscillator 106, and signaling the calibration policy manager 102 that the calibration is done.

Figure 3:
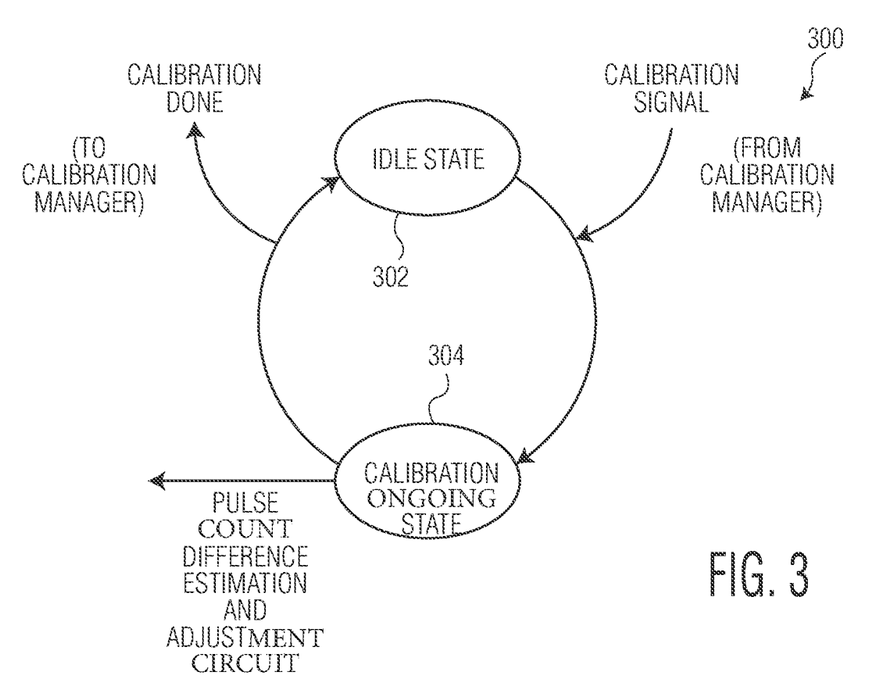
FIG. 3 illustrates operations of a calibration state machine in accordance with an embodiment.

FIG. 3 illustrates operations of a calibration state machine 300 in accordance with an embodiment. The calibration state machine 300 may be responsible for performing the calibration of the oscillator 106 and have an idle state 302 and a calibration ongoing state 304 associated with performing the calibration in an example. The idle state 302 may indicate that no calibration is being performed and the calibration ongoing state 304 may indicate that a calibration is being performed. The calibration manager 102 may provide a signal to the calibration circuit 108 when a calibration is needed. The processing circuit 108 which implements that calibration state machine 300 may receive this signal. If the calibration state machine 300 is in the idle state 302, then the calibration state machine 300 may move to the calibration ongoing state 304 which causes calibration of the frequency of the oscillator 106. If the calibration state machine 300 is already in the calibration ongoing state 304 when the signal is received, then the calibration state machine 300 may stay in the calibration ongoing state 304 since a calibration of the frequency of the oscillator 106 is being performed and ignore the calibration signal. Alternatively, the calibration state machine 300 may queue an indication that another calibration signal has been received and perform another calibration when the calibration state machine 300 returns to the idle state 302 or when the application circuit is awaken after transitioning to a sleep state. In the calibration ongoing state 304, the pulse count difference estimation and frequency adjustment circuit 112 is signaled to cause the frequency of the oscillator 106 to be calibrated as described above and the pulse count difference estimation and frequency adjustment circuit 112 provides a signal to the calibration manager 102 and calibration circuit 108 when the calibration is done. The state of the calibration state machine 300 also returns to the idle state 302.

The processing circuitry 110 may query the sleep controller 134 for the state of the application circuit 104. In an example, the calibration state machine 300 may receive the calibration signal to perform a calibration of the frequency of the oscillator 116 during a time when the application circuit 104 may be transitioning to a sleep state. The processing circuitry 110 may cause a signal to be sent to the sleep controller 134 to block the transition to the sleep state until the calibration of the frequency of the oscillator 116 is complete. Alternatively, the processing circuitry 110 may cause a signal to be sent to the calibration manager 102 which in response informs the sleep controller 134 to delay the transition to the sleep state until the calibration of the frequency of the oscillator 116 is complete. When the calibration is complete, the calibration state machine 300 may then cause the calibration done signal to be sent to the sleep controller 134 or calibration manager 102 so that the sleep controller 134 may be informed that the application circuit 104 may be transitioned to the sleep state.

Example Methods

Figure 4A:
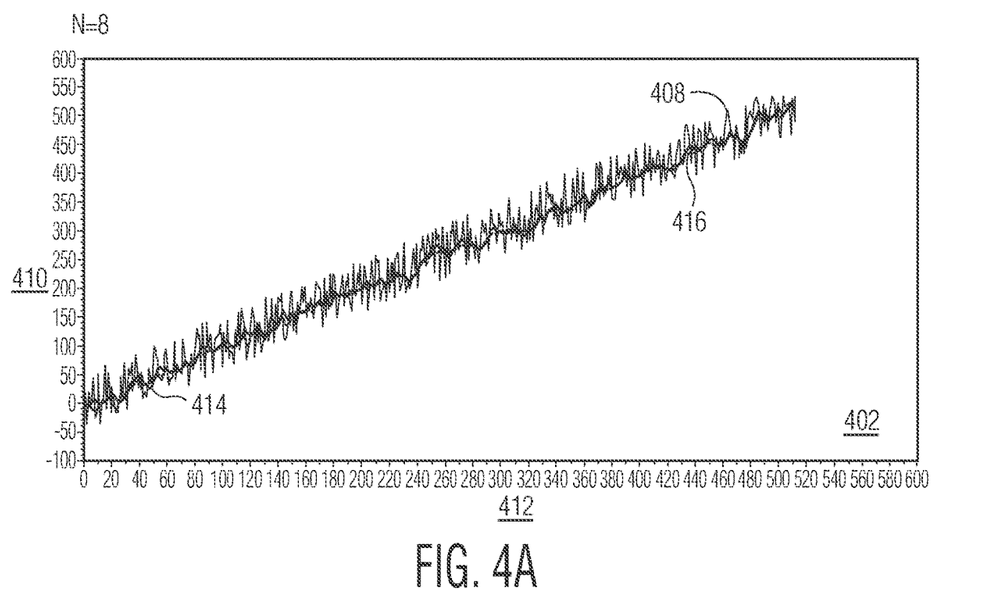
FIGS. 4A, 4B, 4C show plots which illustrate an effect of filtering a pulse count difference measurement of the oscillator using a finite impulse response filtering and first order infinite response filter in accordance with an embodiment.
Figure 4B:
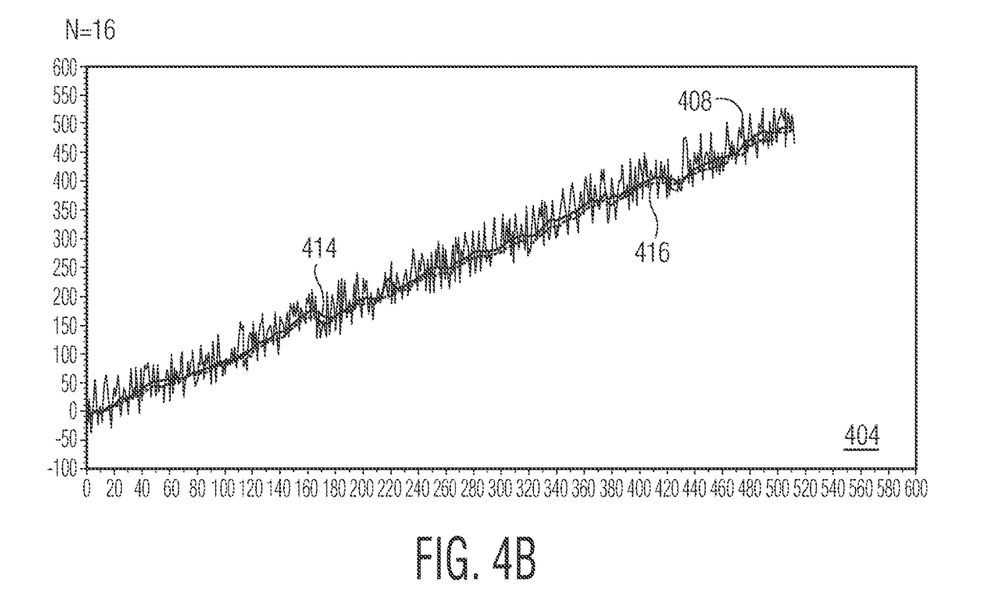
Figure 4C:
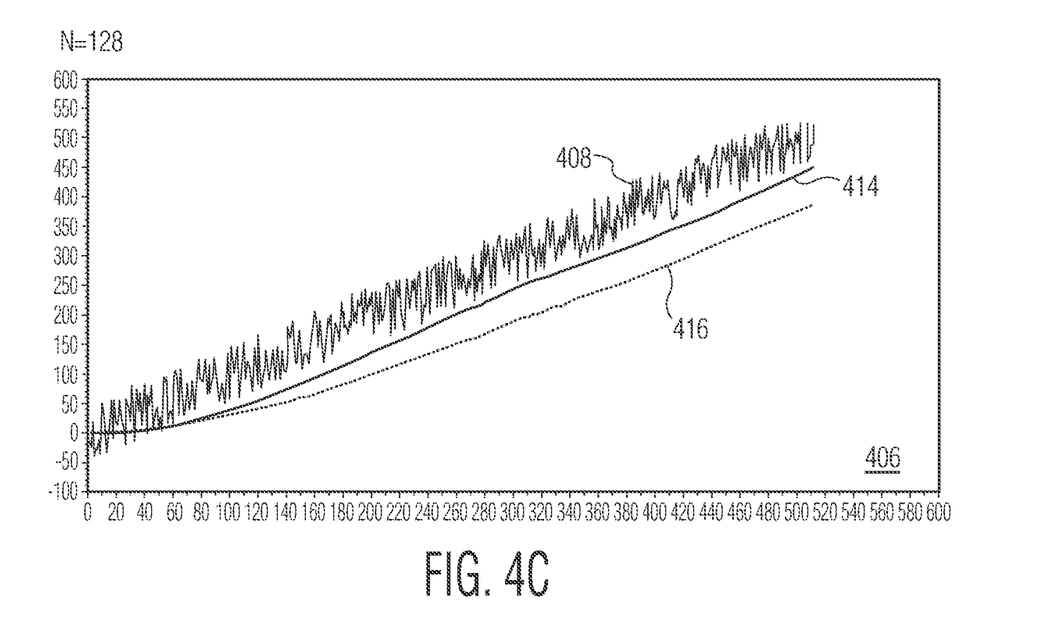

FIGS. 4A, 4B, 4C show plots 402, 404, 406 which illustrate an effect of filtering the pulse count difference measurement of the oscillator 106 using the finite impulse response filtering and first order infinite response filter in accordance with an embodiment. N associated with the filter may be set to one of N=8, N=16, and N=128 corresponding to plots 402, 404, 406 respectively. Signal 408 represents changes in pulse count difference measurement of the oscillator 116 over time on axis 412. The plots 402, 404, 406 show the pulse count difference measurements of the oscillator 106 in signal 408 increase over time and are noisy. Signal 414 shows the pulse count difference estimation as a function of time using the simple averaging filter with different values of N. Signal 416 shows the pulse count difference estimation as a function of time using the infinite impulse response filter for different values of N. Based on the plots 402-406, increasing N allows for more smoothing but with more smoothing there is a higher error between the pulse count difference estimate and a true pulse count difference, and the pulse count difference estimate is less reactive to changes in frequency of the oscillator 116. For example, the pulse count difference estimate for N=128 is not shown to be within the signal 408 suggesting that the pulse count difference estimate has an error compared to plots 402, 404. The plots 402-406 also show that both filters are able to estimate the pulse count difference with similar results which suggest that the infinite response filter may be used to accurately determine the pulse count difference estimate with a lower memory footprint compared to the simple moving average filter.

Figure 5:
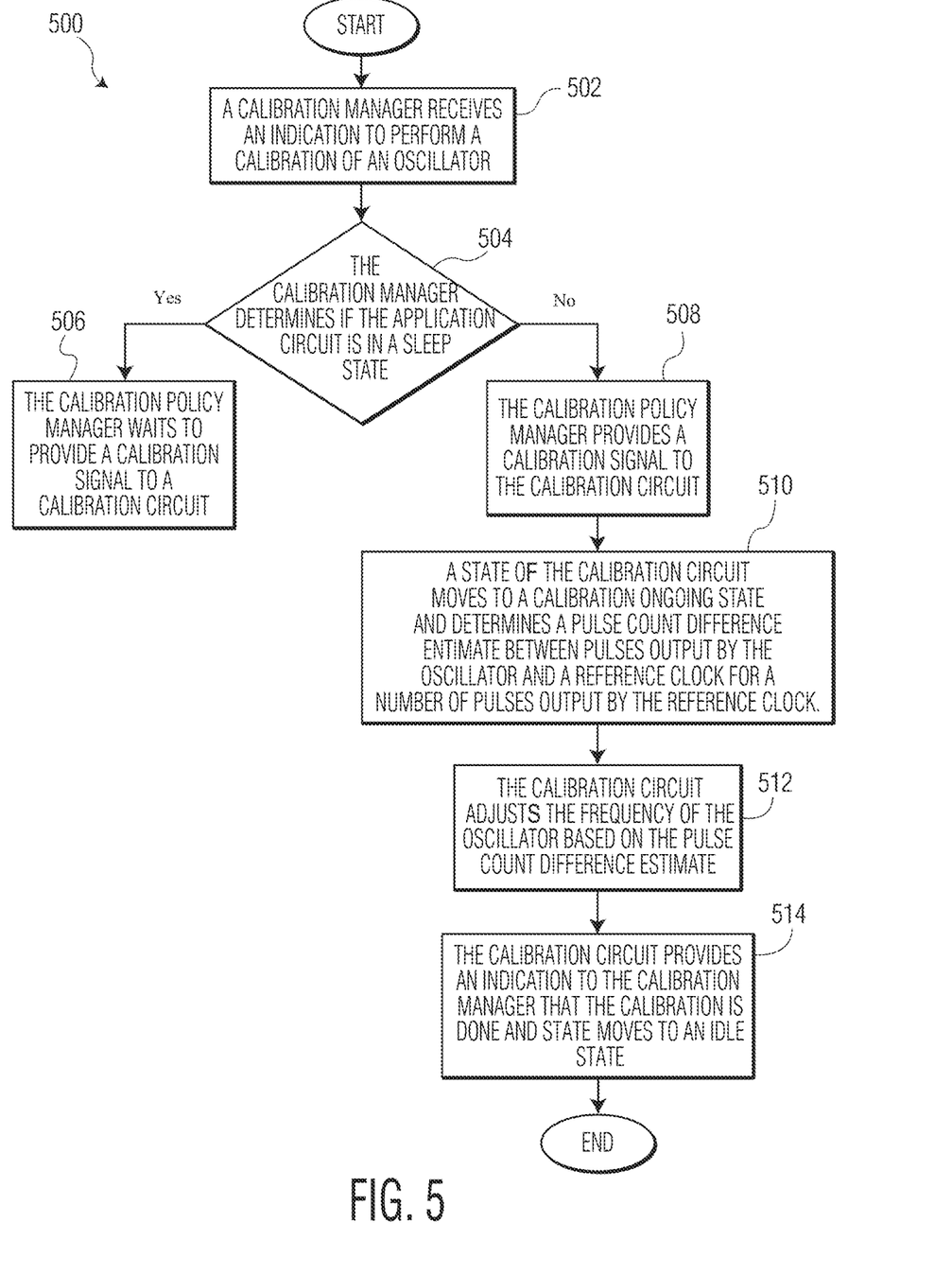
FIG. 5 is a flow chart of example processing associated with a calibration manager and calibration circuit in accordance with an embodiment.

FIG. 5 is a flow chart 500 of example processing associated with the calibration manager 102 and the calibration circuit 108 in accordance with an embodiment. At 502, a calibration manager receives an indication to perform a calibration of an oscillator. In one example, the indication may be provided by a temperature calibrator as a result of detection of a temperature gradient. In another example, the indication may be provided by a mode calibrator based on detection of a certain mode of the application circuit 104. In yet another example, the indication may be provided by a timer-based calibrator as a result of a timer elapsing which indicates a duration when a last calibration of the oscillator was performed. In another example, the indication may be provided by an input calibrator when an increase in oscillator frequency accuracy is needed. At 504, the calibration manager determines if the application circuit is in a sleep state. At 506, if the application circuit is in the sleep state, then the calibration policy manager waits to provide a calibration signal to a calibration circuit. At 508, if the application circuit is in an awake state, then the calibration policy manager provides a calibration signal to the calibration circuit. By providing the calibration signal when the application circuit is awake, the application circuit may consume less power than if the application circuit has to be awaken to perform the calibration. At 510, a state of the calibration circuit moves to an calibration ongoing state and determines a pulse count difference estimate between pulses output by the oscillator and a reference clock for a certain number of pulses output by the reference clock. The pulse count difference may be an indication of the difference in frequency of the oscillator and the reference clock. The pulse count difference estimation may be based on measuring a number of pulses output by the oscillator when a number of pulses is output by the reference clock and applying a filter to the measurements to determine the pulse count difference estimate. The pulse count difference may be an estimate of a frequency error of the oscillator 106 compared to the reference clock 114. At 512, the calibration circuit adjusts the frequency of the oscillator based on the pulse count difference estimate. The compensation may be done in hardware by a trimming process (e.g., adjusting capacitance of a capacitor bank) to adjust a number of pulses output by the oscillator 106 and frequency of the oscillator 106. Alternatively, the compensation may be done in software by adjusting a number of pulses output by the hardware of the oscillator 106 (e.g., RC circuit or LC circuit) and frequency of the oscillator 106. For example, the software of the oscillator 106 may be arranged to cause the oscillator 106 to output a clock pulse for every s clock pulses generated by the hardware, where s is programmable. Further, the calibration circuit may send a signal to delay a transition of the application circuit from an awake state to a sleep state to a sleep controller until the calibration process is completed. At 514, the calibration circuit provides an indication to the calibration manager that the calibration is done and a state of the calibration state machine moves to an idle state.

In one embodiment, a method for calibrating a free running oscillator in a circuit of an electronic device is disclosed. The method comprises: determining that the circuit of the electronic device is in an awake state; measuring an indication of frequency of the free running oscillator in response to the circuit being in the awake state; and calibrating a frequency of the free running oscillator based on the indication of frequency and the circuit being in the awake state. In an example, measuring the indication of frequency comprises measuring a pulse count difference of pulses output by the free running oscillator and a reference clock for a number of pulses output by the reference clock in response to the circuit being in the awake state; and calibrating the frequency of the free running oscillator comprises calibrating the frequency of the free running clock based on the determined pulse count difference and the circuit being in the awake state. In an example, measuring the pulse count difference comprises measuring the pulse count difference a plurality of times and filtering the pulse count difference measurements to determine a pulse count difference estimate used to calibrate the frequency of the free running oscillator. In an example, a number of the pulse count difference measurements which are filtered to determine the pulse count difference estimate is based on a duration that the circuit is in the awake state. In an example, the filtering comprises applying one of the finite impulse response filter and an infinite impulse response filter to the frequency measurements. In an example, measuring the indication of frequency of the free running oscillator comprises determining that the oscillator has not been calibrated for a threshold time and measuring the indication in response to the determination that the oscillator has not been calibrated for a threshold time. In an example, the electronic device is a wireless device and wherein measuring the indication of frequency of the free running oscillator comprises measuring the indication in response to the circuit operating in one of a plurality of wireless modes. In an example, measuring the indication of frequency of the free running oscillator comprises measuring the indication in response to a gradient of the temperature of the electronic device exceeding a threshold level. In an example, the method further comprises delaying the measuring and calibrating if the circuit is not awake and not waking the circuit to only perform the calibration. In an example, the method further comprises sending a signal to delay a transition of the circuit from the awake state to a sleep state until the frequency of the free running oscillator is calibrated.

In another embodiment, an electronic device comprises: a circuit comprising a free running oscillator; a calibration manager arranged to determine that the circuit of the electronic device is in an awake state; and a calibration circuit arranged to measure an indication of frequency of the free running oscillator in response to the circuit being in the awake state; and calibrate a frequency of the free running oscillator based on the indication of frequency and the circuit being in the awake state. In an example, the calibration circuit arranged to measure the indication of frequency comprises the calibration circuit arranged to measure a pulse count difference of pulses output by the free running oscillator and a reference clock for a number of pulses output by the reference clock in response to the circuit being in the awake state; and calibrate the frequency of the free running oscillator comprises calibrating the frequency of the free running clock based on the determined pulse count difference and the circuit being in the awake state. In an example, the calibration circuit arranged to measure the pulse count difference comprises the calibration circuit arranged to measure the pulse count difference a plurality of times and filter the pulse count difference measurements to determine a pulse count difference estimate used to calibrate the frequency of the free running oscillator. In an example, a number of the pulse count difference measurements which are filtered to determine the pulse count difference estimate is based on a duration that the circuit is in the awake state. In an example, the filter is of the finite impulse response filter and an infinite impulse response filter. In an example, the electronic device is a wireless device and wherein the calibration circuit arranged to measure the indication of frequency comprises the calibration circuit arranged to measure the indication of frequency in response to the circuit operating in one of a plurality of wireless modes. In an example, the calibration circuit arranged to measure the indication of frequency comprises the calibration circuit arranged to measure the indication of frequency in response to a gradient of the temperature of the electronic device exceeding a threshold level. In an example, the electronic device further comprises the calibration manager arranged to delay the measuring and calibrating if the circuit is not awake and not waking the circuit to only perform the calibration. In an example, the frequency of the free running oscillator is not calibrated periodically. In an example, the electronic device further comprises the calibration circuit arranged to send a signal to the calibration manager to delay a transition of the circuit from the awake state to a sleep state until the frequency of the free running oscillator is calibrated.

A few implementations have been described in detail above, and various modifications are possible. The disclosed subject matter, including the functional operations described in this specification, can be implemented in electronic circuit, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

What is claimed is:

1. A method for calibrating a free running oscillator in a circuit of an electronic device, the method comprising:
   determining that the circuit of the electronic device is in an awake state;
   measuring an indication of frequency of the free running oscillator in response to the circuit being in the awake state; and
   calibrating a frequency of the free running oscillator based on the indication of frequency and the circuit being in the awake state, wherein the measuring the indication of frequency comprises measuring a pulse count difference of pulses output by the free running oscillator and a reference clock for a number of pulses output by the reference clock in response to the circuit being in the awake state; and the calibrating the frequency of the free running oscillator comprises calibrating the frequency of the free running clock based on a determined pulse count difference and the circuit being in the awake state.

2. The method of claim 1, wherein the measuring the pulse count difference comprises measuring the pulse count difference a plurality of times and filtering the pulse count difference measurements to determine a pulse count difference estimate used to calibrate the frequency of the free running oscillator.

3. The method of claim 2, wherein a number of the pulse count difference measurements which are filtered to determine the pulse count difference estimate is based on a duration that the circuit is in the awake state.

4. The method of claim 3, wherein the filtering comprises applying one of a finite impulse response filter and an infinite impulse response filter to the frequency measurements.

5. The method of claim 1, wherein the measuring the indication of frequency of the free running oscillator comprises determining that the oscillator has not been calibrated for a threshold time and measuring the indication in response to the determination that the oscillator has not been calibrated for the threshold time.

6. The method of claim 1, wherein the electronic device is a wireless device and wherein the measuring the indication of frequency of the free running oscillator comprises measuring the indication in response to the circuit operating in one of a plurality of wireless modes.

7. The method of claim 1, wherein the measuring the indication of frequency of the free running oscillator comprises measuring the indication in response to a gradient of temperature of the electronic device exceeding a threshold level.

8. The method of claim 1, further comprising delaying the measuring and calibrating if the circuit is not awake and not waking the circuit to only perform the calibration.

9. The method of claim 1, further comprising sending a signal to delay a transition of the circuit from the awake state to a sleep state until the frequency of the free running oscillator is calibrated.

10. An electronic device comprising:
    a circuit comprising a free running oscillator;
    a calibration manager arranged to determine that the circuit of the electronic device is in an awake state; and
    a calibration circuit arranged to measure an indication of frequency of the free running oscillator in response to the circuit being in the awake state; and calibrate a frequency of the free running oscillator based on the indication of frequency and the circuit being in the awake state, wherein the calibration circuit arranged to measure the indication of frequency comprises the calibration circuit arranged to measure a pulse count difference of pulses output by the free running oscillator and a reference clock for a number of pulses output by the reference clock in response to the circuit being in the awake state; and calibrate the frequency of the free running oscillator comprises calibrating the frequency of the free running clock based on a determined pulse count difference and the circuit being in the awake state.

11. The electronic device of claim 10, wherein the calibration circuit arranged to measure the pulse count difference comprises the calibration circuit arranged to measure the pulse count difference a plurality of times and filter the pulse count difference measurements to determine a pulse count difference estimate used to calibrate the frequency of the free running oscillator.

12. The electronic device of claim 11, wherein a number of the pulse count difference measurements which are filtered to determine the pulse count difference estimate is based on a duration that the circuit is in the awake state.

13. The electronic device of claim 11, wherein the filter is one of a finite impulse response filter and an infinite impulse response filter.

14. The electronic device of claim 10, wherein the electronic device is a wireless device and wherein the calibration circuit arranged to measure the indication of frequency comprises the calibration circuit arranged to measure the indication of frequency in response to the circuit operating in one of a plurality of wireless modes.

15. The electronic device of claim 10, wherein the calibration circuit arranged to measure the indication of frequency comprises the calibration circuit arranged to measure the indication of frequency in response to a gradient of temperature of the electronic device exceeding a threshold level.

16. The electronic device of claim 10, further comprising the calibration manager arranged to delay the measuring and calibrating if the circuit is not awake and not waking the circuit to only perform the calibration.

17. The electronic device of claim 10, wherein the frequency of the free running oscillator is not calibrated periodically.

18. The electronic device of claim 10, further comprising the calibration circuit arranged to send a signal to the calibration manager to delay a transition of the circuit from the awake state to a sleep state until the frequency of the free running oscillator is calibrated.

\* \* \* \* \*